United States Patent [19]

Bejerano

[11] Patent Number: 4,721,228
[45] Date of Patent: Jan. 26, 1988

[54] APPARATUS FOR DISPENSING ELONGATED SMALL MECHANICAL PARTS

[75] Inventor: Abraham Bejerano, Costa Mesa, Calif.

[73] Assignee: ITT Corporation, New York, N.Y.

[21] Appl. No.: 718,909

[22] Filed: Apr. 3, 1985

[51] Int. Cl.⁴ .................................... G07F 11/00
[52] U.S. Cl. .................................... 221/13; 221/83; 221/265; 227/3; 227/117
[58] Field of Search .................................... 221/2, 4–5, 221/7, 9, 13, 76, 82–83, 224, 265; 227/3, 117; 29/564.1; 198/750, 761, 763

[56] References Cited

U.S. PATENT DOCUMENTS

| | | | |
|---|---|---|---|
| 581,194 | 4/1897 | Buerdsell | 194/85 |
| 2,653,850 | 9/1953 | Vollten | 221/113 X |
| 3,240,387 | 3/1966 | Turner | 221/243 |
| 3,339,798 | 9/1967 | Katz | 221/276 X |
| 3,593,882 | 7/1971 | Rhindress | 221/113 X |
| 3,915,292 | 10/1975 | Brown | 221/200 X |
| 3,924,730 | 12/1975 | Brown | 198/761 |
| 3,964,600 | 6/1976 | Vensel | 198/761 |
| 4,150,766 | 4/1979 | Westendorf et al. | 221/112 |
| 4,511,058 | 4/1985 | Carminati | 221/2 |
| 4,629,091 | 12/1986 | Lunn | 221/12 |

FOREIGN PATENT DOCUMENTS 264486 3/1964 Australia .................................... 221/265

Primary Examiner—Joseph J. Rolla
Assistant Examiner—Michael S. Huppert
Attorney, Agent, or Firm—T. L. Peterson

[57] ABSTRACT

A system for dispensing components one-at-a-time upon demand for utilization comprises a component handling assembly and a buffer assembly. The component handling assembly receives bulk quantities of the components and when activated, properly orients each component and supplies the components in a randomly timed sequence to the buffer assembly. The buffer assembly comprises a cylindrical upper receiving housing having a plurality of cylindrical through-chambers radially disposed in a circular pattern and rotatable about a central generally vertical axis. A cylindrical lower dispensing member is closely aligned and coaxially rotatable both independently and together with the receiving housing. The dispensing member has a planar upper surface which forms a bottom cover for the chambers in the upper receiving housing and has a single passageway that can be aligned with each of the upper receiving chambers to dispense a component.

14 Claims, 5 Drawing Figures

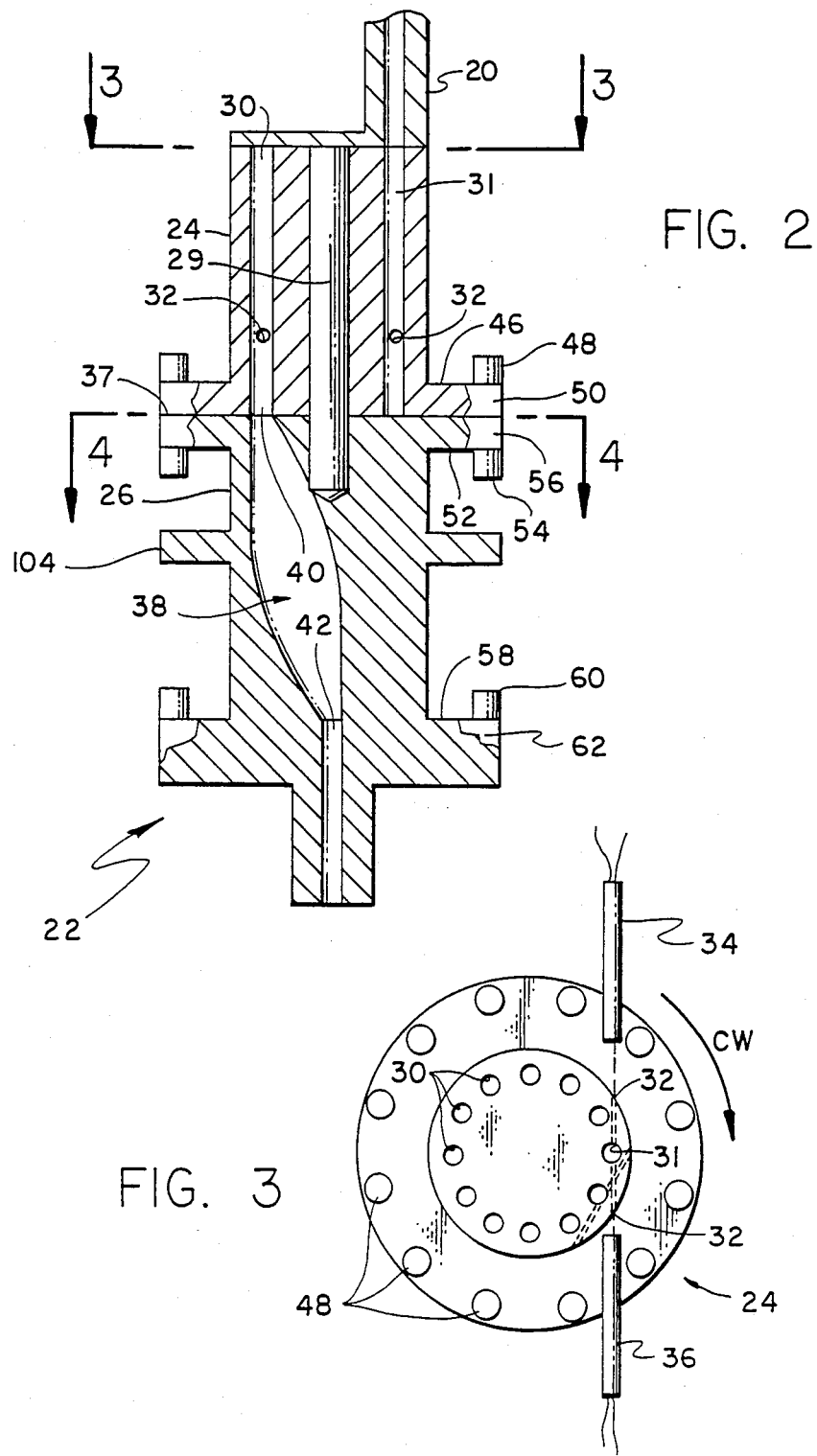

APPARATUS FOR DISPENSING ELONGATED SMALL MECHANICAL PARTS

BACKGROUND OF THE INVENTION

The invention relates generally to an apparatus for sorting bulk quantities of relatively small mechanical components and dispensing them discretely.

In the prior art machines for dispensing relatively small objects discretely or in uniform quantities have been devised for purposes ranging from vending of pills or pellets, candy or peanuts, to small mechanical parts fed into a further processing device.

A particular problem is presented for the dispensing of items such as electrical contacts to a crimping machine, wherein a wire is inserted into a hollow sleeve in the back of the contact and is attached by crimping the sleeve over the wire. While the contacts are in bulk within a conventional dispensing apparatus, the pin (or socket) tips of the contacts tend to become "nested" in the hollow sleeves of other contacts in a telescoping fashion. The nested contacts cannot be properly or efficiently utilized by the crimping machine.

A general background of prior art is disclosured in U.S. Pat. Nos. 581,194; 2,53,850; 3,339,798; and 3,593,882. Those patents relate to vending and dispensing apparatus generally, the dispensed items including boxes, cakes, poker chips, one-use soap tablets and foods items such as heated rolls or the like. Operation of those devices is automatic upon prper user procedure.

More specific to the part dispensing art, U.S. Pat. No. 3,240,387 discloses the loading of openings in a disc through a passage from an external soruce of parts. The parts are resiliently loaded into the disc, an activating plunger advances the parts through a feed passage into the successively aligned openings in the disc. Laterally resilient means at the lower end of the feed passage permits rapid advancement of the disc without damage to the dispensed parts due to shock and vibration resulting from such high speed operation.

In U.S. Pat. No. 4,150,766 there is shown an apparatus which utilizes concentric chambers of a drum to dispense pills or capsules of medication, vitamins, or the like, on a one-a-day basis. The device is manually operated and indexed by day of the week. The capsules are fed to a single passage dispensing cap from cyclindrical chambers each having a diameter corresponding to the capsule which prevents unintended multiple dispensing of the capsules. The capsules are stacked end-to-end within the cylinder, which presents no nesting problem since the capsules are smooth and symmetrical and do not engage or attach to each other.

The configuration of the prior art devices could not function satisfactorily for dispensing such items as elongated, hollow electrical connector contacts having pin ends. The pin ends of a bulk quantity of such contact become nested in the hollow end of adjacent contacts in an unintended telescoping relationship which precludes orderly dispensing of the contacts one at a time. The present invention solves these problems by a unique "Buffer Assembly" which receives parts from a conventional Vibratory Contact Feed Bowl, and dispenses these parts on demand one at a time to a conventional crimper.

SUMMARY

A general object of the invention is to provide a system for dispensing components one-at-a-time upon demand for utilization. The system comprises a component handling assembly and a buffer assembly. The component handling assembly receives bulk quantities of the components and when activated, properly orients each component and supplies the components in a randomly timed sequence to the buffer assembly. The buffer assembly comprises a cylindrical upper receiving housing having a plurality of cylindrical through-chambers radially disposed in a circular pattern and rotatable about a central generally vertical axis. A cylindrical lower dispensing member is closely aligned and coaxially rotatable with the receiving housing. The dispensing member has a planar upper surface which forms a bottom cover for the chambers in the upper receiving housing and has a single passageway that can be aligned with each of the upper receiving chambers to dispense a component from a specific chamber out through the lower dispensing member.

The system utilizes a controller which interacts with the component handling assembly, the buffer assembly and the demand switch for a component. The buffer assembly has a means for sensing if a chamber under the exit chute of the component handling assembly is empty or contains a component. If an occupied chamber is sensed, an advancement and indexing means is activated to rotate both the upper receiving housing and the lower dispensing member synchronously in one direction, to continuously load the buffer assembly. When a utilization demand signal from the switch is received by the controller, a second advancement and indexing means is activated to rotate only the lower dispensing member in the opposite direction than the receiving housing, to align the passageway with an occupied chamber to dispense a component.

While the novel features of the invention are set forth with particularity in the appended claims, the invention will be better understood along with other features thereof from the following detailed description taken in conjunction with the drawings, in which:

BRIEF DESCRIPTION OF THE DRAWINGS

FIG. 2 is an axial sectional front elevation view of the buffer assembly of FIGS. 1;

FIG. 3 is a partially sectional plan view taken along line 3—3 of FIG. 2 with some additional components from FIG. 1;

DETAILED DESCRIPTION

Although the invention is adapted for one-at-a-time dispensing of substantially any elongated, small cross-section mechanical part, it will be described as a dispenser of pin type electrical components having a hollow end for insertion of a wire and crimping the walls of the hollow end ot secure the wire in a firm electrical and mechanical attachment.

Figure 1:
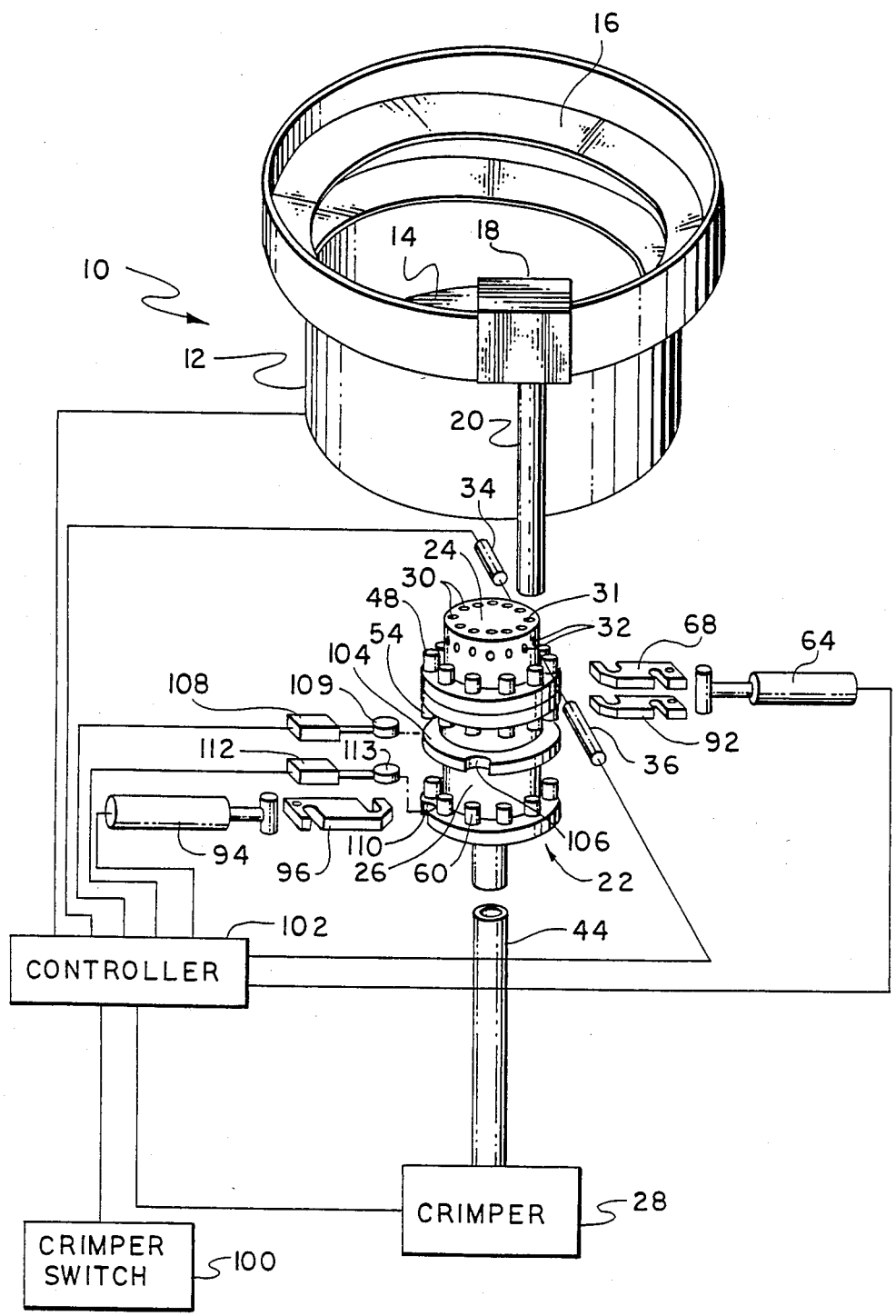
FIG. 1 is a partially exploded perspective view showing the essential parts of the system and buffer dispenser assembly according to the invention.

Referring first to FIG. 1, there is shown a vibratory parts handling bowl assembly 10 having a vibrating base 12 and an interior bowl 14 with an upwardly spiralled track 16 within the bowl. The function of this assembly is to deliver parts up the spiralled track 16 through a selector gate 18 and into an exit chute 20. Parts are loaded in random batches into the bowl 14. The vibrating base causes the parts to migrate upwardly along the spiralled track 16 and into the selector gate 18. The selector gate 18 permits only properly oriented electrical components to pass from the bowl into the exit chute 20. Reversed or nested components pass over this gate, fall back into the center of the bowl 14 and vibrate free to restart the migration upwardly along the track. The selector gate 18 is specifically designed for the properly oriented shape of the particular electrical component. A typical vibratory bowl assembly is commerically available from FMC Corporation, Material Handling Equipment Division, Vibratory Equipment Operation, Homer City, Pa, 15748. Such devices are also disclosed in U.S. Pat. Nos. 3,915,292; 3,924,730 and 3,964,600.

The parts handling bowl assembly 10 thus provides a randomly timed succession of unnested, properly oriented parts to a buffer assembly 22. The buffer assembly includes an upper receiving housing 24 for receiving parts from the bowl assembly and a lower dispensing member 26 for dispensing electrical components upon demand to a crimper 28 for utilization. The receiving housing 24 and dispensing member 26 are closely aligned and are rotatable independently on a common central axis 29.

Referring also to FIGS. 2 and 3, the receiving housing 24 of the buffer assembly has a plurality of generally cylindrical chambers 30 equally disposed radially in a circular arrangement about the central axis. Twelve chambers are shown but any convenient number of chambers can be utilized. Each chamber can be aligned and indexed to a position referred to as chamber 31 to receive an electrical component from the exit chute 20 of the bowl assembly 10. Each chamber has a lateral light passageway 32 which intersects the chamber and can be used with a light source 34 and a photo detector 36 to sense and determine whether an electrical component is occupied within a specific chamber 31, or if the chamber is empty.

Figure 4:
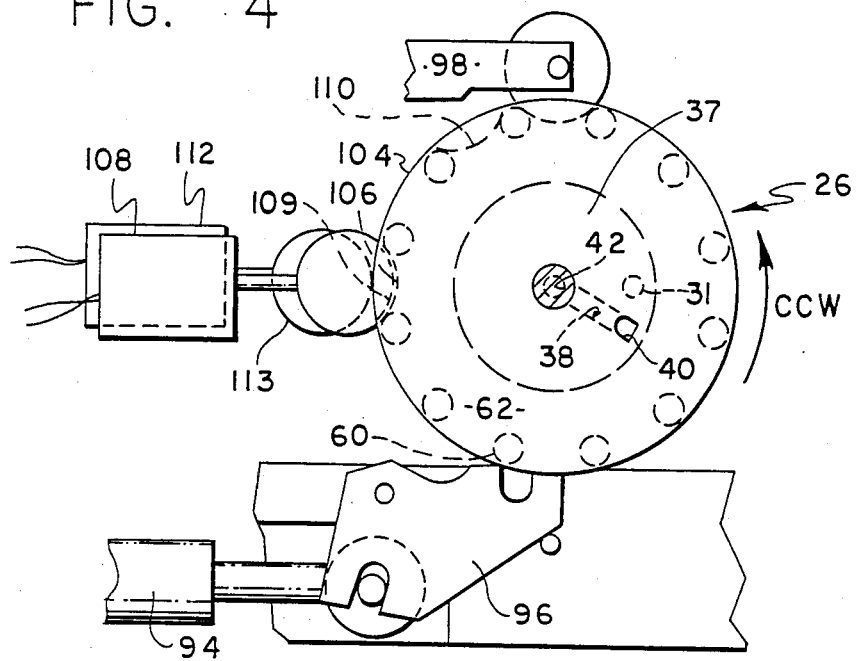
FIG. 4 is a partially sectional plan view taken along line 4—4 of FIG. 2 with some additional components from FIG. 1.

Referring also to FIG. 4, the lower dispensing member 26 of the buffer assembly 22 includes a flat generally horizontal upper surface 37 which acts as a bottom cover for the chamber 30 in the receiving housing 24. The dispensing member further includes a single dispensing passageway 38 which can be aligned and indexed with each of the chambers 30 in the upper receiving housing. The dispensing passageway 38 (shown particularly in FIGS. 2 and 4) has an upper entrance aperture 40 corresponding to the chambers 30, and an central exit aperture 42 corresponding to a receiver 44 of the crimper 28. The passageway 38 is contoured so that an electrical component may pass smoothly from each of the aligned upper chambers 30 downwardly and radially inwardly to the central exit aperture 42 to the common crimper receiver 44.

Figure 5:
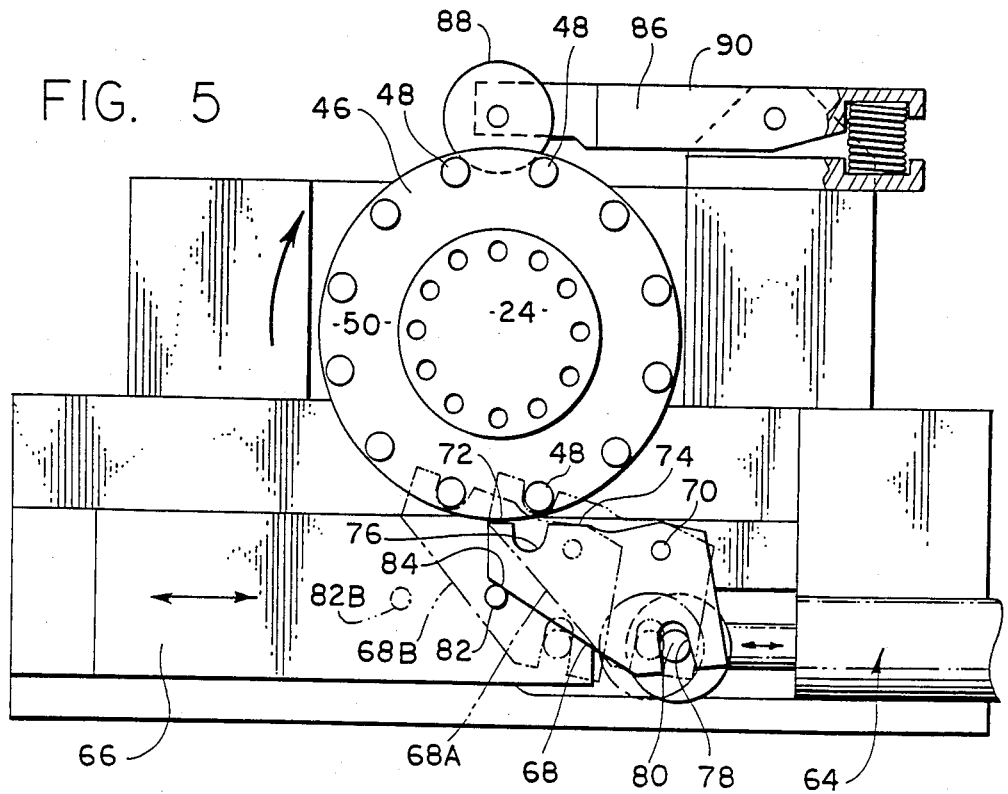
FIG. 5 is a plan view showing one of the advancement ratchet and detent mechanism of FIG. 1.

Referring also to FIG. 5, there is shown a typical mechanism for advancing and indexing the buffer assembly 22. At the lower end of the upper receiving housing 24, there is an annular flange 46 having a series of teeth 48 forming a circular receiver housing drive gear 50. Similarly, at the upper end of the dispensing member 26, there is an upper annular flange 52 having a series of teeth 54 forming an (upper) dispensing member drive gear 56. At the lower end of the dispensing member 26 there is also a lower annular flange 58 having a series of teeth 60 forming a (lower) dispensing member drive gear 62. The teeth 48, 54 and 60 are shown as cylindrical cogs extending perpendicularly from the flange, but a variety of radial or sprocket teeth could be utilized.

The teeth of the drive gears 50, 56 and 62 can be advanced by a ratchet type pusher device. A typical pusher device 64 is pneumatically operated and shown particularly in FIG. 5. Pusher device 64 is carried by a slidable frame 66 and includes a generally rectangularly shaped drive lug 68. Lug 68 is pivotally attached at the inward right-hand corner (as shown in the FIG. 5) thereof, to frame 66, by a pin fastener 70. The inward left-hand portion (as shown in FIG. 5) of lug 68 includes two tangs 72 and 74 forming a semi-cylindrical slotted opening 76 adapted to engage one of the teeth 48. The outward right-hand portion of lug 68 has a semi-cylindrical slotted opening 78 adapted to engage an in and out actuator 80. The lug is further positioned by a stop 82 which is in contact with the outward edge 84 of the lug when the lug is retracting. As the pusher device 64 is activated, the actuator 80 is extended (to the left in FIG. 5) causing the lug 68 to pivot about pin fastener 70 until slotted opening 76 engages a tooth 48 of the drive gear (shown as phantom lines 68A), the actuator is further extended which rotates the buffer assembly about the central axis 29 to advance the assembly to the next desired index position (shown as phantom line 68B). The assembly is secured in the newly indexed position by a detent mechanism 86 shown as a roller 88 which nests between adjacent teeth 48 of the gear and which has a spring loaded lever arm 90 to exert inward force on the roller. The actuator 80 is then retraced to the original position which causes the lug 68 to pivot away from the tooth 48 until it contacts stop 82 (at position 82B) then translates (to the right in FIG. 5) back to the original position (68).

It is understood that the foregoing mechanism will advance the upper receiving housing 24 in a clockwise direction to the next indexed position by lug 68 from pusher device 64. Similarly, a second lug 92 (shown in FIG. 1) can also be actuated by pusher device 64 to engage one of the teeth 54 on the drive gear 56 to advance the lower dispensing member 26 in a clockwise direction synchronously with the receiving housing 24. And a similar pusher device 94 (shown in FIG. 4), can be mounted on the opposite side of the buffer assembly having a third lug 96 for similar engagement with one of the teeth 60 of lower dispensing member drive gear 62 to advance the dispensing member in the counter clockwise direction. The dispensing member 26 is indexed by detent mechanism 98 similarly as 86.

Referring also to the block diagram of FIG. 1, the operation of the buffer assembly 22 can be easily controlled so that a bulk quantity of components can be added to the parts handling bowl assembly 10 and upon demand from a crimper switch 100 can be supplied one at a time to the crimper 28.

The sequence of events which utilizes the buffer assembly, 22, is initiated by a controller 102 sensing, by the photodetector 36, that there is an empty chamber 31 indexed under chute 20. the controller activates the parts handling bowl assembly 10 and an electrical component is delivered to the chamber 31. The presnece of the contact within the now occupied chamber 31 is detected by photodetector 36, and the pusher device 64 is actuated by the controller to advance both upper receiving housing 24 and the lower dispensing member 26 in the clockwise direction, to position the adjacent chamber 30 into the chamber 31 position. This receiving and indexing procedure will continue so long as there is an empty chamber sensed by the controller. The receiving housing and the dispensing member are advanced together in the same direction to insure that a filled chamber 30 cannot be inadvertently advanced onver the dispensing passageway 38 to dispense a component to the crimper 28 without a demand signal from the crimper switch.

Referring particularly to FIGS. 1 and 4, when the controller 102 receives a demand for a component by the crimper switch 100, the pusher device 64 is deactivated, and pusher device 94 is actuated to rotate the dispencing member 26 to the next counter-clockwise indexed position to align the passageway 38 with an occupied chamber 30 to dispense an electrical component to the crimper.

The buffer assembly 22 operates in the described manner on a generally continuous basis, receiving components in the upper receiving housing 24, on a generally randomly timed basis, in a clockwise indexing manner, and dispensing the components upon demand from the lower dispensing member 26 in a counter-clockwise indexing manner. However, the buffer assembly further includes controlling means to deactivate the parts handling assembly 10 when all of the available chambers 30 are occupied as well to deactivate the pusher device 64 to prevent continuous indexing of a fully occupied upper receiving housing, and also to insure that the passageway 38 is not indexed under the chute 20 (chamber 31) from the parts handling assembly. Referring particularly to FIGS. 1 and 4, there is shown an intermediate flange 104 extending radially outwardly from dispensing member 26. The intermediate flange includes a detent 106 which corresponds with the position of the dispensing member 26 when the passageway 38 is one indexed position clockwise (the position shown in FIG. 4) from the position of the chute 20 (chamber 31 of the receiving housing). A switch 108 has an actuator 109 which follows the circumference of the flange 104 and is adapted to engage the detent 104 to deactivate the pusher 94 when the dispensing portion is in the predescribed indexed position. Similarly, lower flange 58 includes a detent 110 which corresponds with the position of dispensing member 26 when the passageway 38 is one indexed position counterclockwise from the position of chamber 31 of the receiving housing. A switch 112 has an acutator 113 which follows the circumference of flange 58 and is adapted to engage detent 110 and can be deactivated by rotation of the lower dispensing portion in the clockwise direction to the predescribed index psition. In this indexed position, the upper chambers 30 are all occupied and the controller 102 deactivates pusher 64 and the parts handling assembly 10.

While specific arrangements of the present invention have been illustrated and described herein, it is realized that modifications and changes will occur to those skilled in the art. It is therefore to be understood that the appended claims are intended to cover all such modifications and changes as fall within the true spirt and scope of the invention.

What is claimed is:

1. A buffer assembly for handling small elongated components, comprising:
   means for receiving individual components in a generally random time sequence and storing a quantity thereof in a circular array of vertical chambers which are each closed except at their opposite ends; and
   means for dispensing the components one-at-a-time from said chambers upon demand for utilization, said dispensing means comprising a member rotatably mounted on a generally vertical central axis coaxial with said circular array and having a single generally vertical passageway therethrough, said passageway having an upper inlet end adapted to register with coresponding ones of said chambers and a lower outlet end located on said axis for dispensing components at a single location.

2. A buffer assembly for handling small elongated components, comprising:
   means for receiving individual components in a generally random time sequence and storing a quantity thereof;
   means for dispensing the components one-at-a-time from said receiving means upon demand for utilization;
   said receiving means comprising a housing rotatably mounted on a generally vertical central axis and having a plurality of generally vertical chambers therethrough radially disposed about the axis in a circular arrangement, a component being receivable in each chamber when said chamber is aligned in a specific indexed component receiving position;
   said dispensing means further comprising a member rotatably mounted ons aid central axis and having a planar upper surface forming bottom covers for said chambers, and having a generally vertical passageway therethrough which can be aligned with each said chamber;
   means for rotatably indexing each of said chamber of said receiving housing to a specific position for receiving a component; and
   means for rotatably indexing said passageway of said dispensing member to desired positions corresponding to the indexed positions of said chambers.

3. The assembly according to claim 2 wherein: said receiving housing indexing means and said dispensing member indexing means are synchronously rotatably indexable in one direction, to receive components in the specific position for each said chamber.

4. The assembly according to claim 3 wherein said passageway indexing means is rotatably indexable, in the direction opposite of said direction for receiving components, so that said passageway is indexable with one of said chambers to dispense a component.

5. A buffer assembly for handling small elongated components, comprising:
   a receiving housing rotatably mounted on a generally vertical central axis and having a plurality of vertical chambers therethrough radially disposed about the axis in a circular arrangement and adapted to receive a component into said chambers;
   a dispensing member rotatably mounted on the axis and closely aligned with said receiving housing;
   said dispensing member having a generally planar upper surface forming bottom covers for said chambers of said receiving housing, and having a generally vertical passageway therethrough which can be aligned with each said chamber;
   first means for rotatably indexing said receiving housing and said dispensing member in a desired relative position for receiving a component; and second means for rotatably indexing said dispensing member in a desired position for the dispensing of a component upon demand for utilization.

6. The assembly according to claim 5 wherein said first receiving housing and dispensing member indexing first means comprises a first pusher device which rotates the housing and member synchronously in a first rotational direction; and
wherein said dispensing member indexing second means comprises a second pusher device which rotates only the dispensing member in a rotational direction opposite to the first rotational direction.

7. The assembly according to claim 6 further comprising means for sensing whether a component is present in at least one of said chambers.

8. The assembly according to claim 7 wherein said component sensing means comprises:
said receiving housing having a plurality of light passageways generally laterally disposed through each of said chambers; and
a light source and light sensing means adapted to cooperate with each of said light passageways.

9. The assembly according to claim 7 further comprising a controller adapted to interact with said component sensing means to control said indexing first means to successively index said receiving housing to receive a component in said chambers.

10. The assembly according to claim 6 wherein said receiving housing can receive a component in only one chamber receiving position; and which further comprises:
controller means whereby said first pusher means is deactivated so that said passageway cannot be indexable into alignment with the chamber receiving position of said receiving housing.

11. The assembly according to claim 10, further comprising:
said controller means whereby said second pusher means is deactivated so that said passageway cannot be indexable into alignment with the chamber receiving position of said receiving housing.

12. A system for dispensing small elongated properly oriented components one-at-a-time upon demand, comprising:
means for separating and orienting the components from a bulk quantity thereof and discharging the components one-at-a-time on a generally random time sequence;
a receiving housing rotatably mounted on a generally vertical central axis and having a plurality of vertical chambers therethrough radially disposed about the axis in a circular arrangement;
said receiving housing adapted to successively receive a component, discharged from said separating means, in one of said chambers for storage thereof;
a dispensing member rotatably mounted on the central axis and closely aligned with said receiving housing, having a generally planar upper surface forming bottom covers for said chambers of said receiving housing, and having a generally vertical passageway therethrough which can be aligned with each one of said chambers upon demand for dispensing a component;
first means for synchronously indexing said receiving housing and said dispensing member in a specific chamber receiving position for receiving a component in one of said chambers;
second means for rotatably indexing said dispensing member for dispensing a component from one of said chambers;
means for sensing whether there is a component occupied in the chamber receiving position of said receiving means;
means for sensing whether said passageway of said dispensing member is indexed in a position one position adjacent to the chamber receiving position of said receiving housing;
a controller which intersects with the demand for a component, said separating means, said first indexing means, said second indexing means, said component in chamber sensing means and said passageway position sensing means, to control the successive receiving and storing of components in said receiving housing and the dispensing of component from said dispensing member upon demand for utilization, and to control the deactivation of the separating means when the available chambers of the receiving housing are occupied, and to control the deactivation of the corresponding first and second pusher means to prevent said passageway from being indexable into the chamber receiving position of said receiving housing.

13. The system according to claim 12 wherein said separating and orienting means comprises a vibratory parts handling assembly.

14. The assembly according to claim 2 wherein said passageway is contoured so that a component can pass from each of said chambers downwardly and radially inwardly to a generally central axial exit from said member.

* * * * *